United States Patent
Chen et al.

(10) Patent No.: US 7,291,528 B2
(45) Date of Patent: Nov. 6, 2007

(54) METHOD OF MAKING STRAINED SEMICONDUCTOR TRANSISTORS HAVING LATTICE-MISMATCHED SEMICONDUCTOR REGIONS UNDERLYING SOURCE AND DRAIN REGIONS

(75) Inventors: Huajie Chen, Danbury, CT (US); Dureseti Chidambarrao, Weston, CT (US); Oleg G. Gluschenkov, Poughkeepsie, NY (US); An L. Steegen, Stamford, CT (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 296 days.

(21) Appl. No.: 11/081,271

(22) Filed: Mar. 16, 2005

(65) Prior Publication Data

US 2005/0158931 A1    Jul. 21, 2005

Related U.S. Application Data

(62) Division of application No. 10/604,607, filed on Aug. 8, 2003, now Pat. No. 6,891,192.

(51) Int. Cl.
*H01L 21/00* (2006.01)

(52) U.S. Cl. ........................ 438/199; 438/153; 438/154; 257/E21.001

(58) Field of Classification Search ................ 438/191, 438/199, 153–154
See application file for complete search history.

(56) References Cited

U.S. PATENT DOCUMENTS

| | | | | |
|---|---|---|---|---|
| 6,228,722 | B1 * | 5/2001 | Lu | 438/279 |
| 6,417,547 | B2 * | 7/2002 | Kang | 257/369 |
| 2004/0262683 | A1 * | 12/2004 | Bohr et al. | 257/338 |

* cited by examiner

*Primary Examiner*—Thanh Nguyen
(74) *Attorney, Agent, or Firm*—Daryl K. Neff, Esq.; H. Daniel Schnurmann

(57) ABSTRACT

A p-type field effect transistor (PFET) and an n-type field effect transistor (NFET) of an integrated circuit are provided. A first strain is applied to the channel region of the PFET but not the NFET via a lattice-mismatched semiconductor layer such as silicon germanium disposed in source and drain regions of only the PFET and not of the NFET. A process of making the PFET and NFET is provided. Trenches are etched in the areas to become the source and drain regions of the PFET and a lattice-mismatched silicon germanium layer is grown epitaxially therein to apply a strain to the channel region of the PFET adjacent thereto. A layer of silicon can be grown over the silicon germanium layer and a salicide formed from the layer of silicon to provide low-resistance source and drain regions.

17 Claims, 5 Drawing Sheets

METHOD OF MAKING STRAINED SEMICONDUCTOR TRANSISTORS HAVING LATTICE-MISMATCHED SEMICONDUCTOR REGIONS UNDERLYING SOURCE AND DRAIN REGIONS

CROSS-REFERENCE TO RELATED APPLICATION

This application is a divisional of commonly owned U.S. patent application Ser. No. 10/604,607 filed Aug. 8, 2003 now U.S. Pat. No. 6,891,192, the entire contents of which is hereby incorporated herein by reference.

BACKGROUND OF THE INVENTION

The present invention relates to the fabrication of semiconductor integrated circuits, and more specifically to an apparatus and method of making strained semiconductor complementary metal oxide semiconductor (CMOS) transistors having lattice-mismatched source and drain regions.

Both theoretical and empirical studies have demonstrated that carrier mobility with a transistor is greatly increased when a strain is applied to the transistor's conduction channel. In p-type field effect transistors, the application of a compressive longitudinal strain to the conduction channel is known to increase the drive currents of the PFET. However, if that same strain is applied to the conduction channel of an NFET, its performance decreases.

It has been proposed to apply a tensile longitudinal strain to the conduction channel of an NFET and apply a compressive longitudinal strain to the conduction channel of a PFET. Such proposals have focused on masked processes involving the masking of a PFET or NFET portion of the chip and altering the materials used in shallow trench isolation regions to apply the strain. The proposals have also included masked processes centered on modulating intrinsic stresses present in spacer features.

Silicon germanium is a desirable lattice-mismatched semiconductor for use in forming strained silicon transistor channels. A strain is created when a first semiconductor is grown onto a single-crystal of a second semiconductor when the two semiconductors are lattice-mismatched to each other. Silicon and silicon germanium are lattice-mismatched to each other such that the growth of one of them onto the other produces a strain which can be either tensile or compressive.

Silicon germanium grows epitaxially on silicon having a crystal structure aligned with the silicon crystal structure. However, because silicon germanium normally has a larger crystal structure than silicon, the epitaxially grown silicon germanium becomes internally compressed.

In other proposals using strained silicon, silicon germanium forms a single-crystal layer of an entire substrate. In such case, the silicon germanium layer is known as a relaxed layer, because the strain is released by forming dislocations within the silicon germanium layer. When a single-crystal silicon layer is grown epitaxially on a relaxed SiGe crystal region, a tensile strain is produced in the epitaxially grown silicon crystal. This results in improved electron mobility, which is capable of improving the performance of an NFET. However, such technique requires the SiGe to be relaxed, which requires that the SiGe layer be very thick, i.e. 0.5 to 1.0 μm. Improvements in the mobility of holes is difficult to obtain because to do so, the SiGe layer requires a large percentage of germanium, which can result in excessive dislocations in the SiGe crystal, causing yield problems. Further, processing costs can be prohibitive.

Other techniques such as graded Ge concentration and chemical mechanical polishing methods are used to improve the quality of the films. However, those techniques are plagued by high cost and high defect density.

Accordingly, it would be desirable to create a strain in the channel region of a PFET without the use of a thick SiGe crystal region. It would be desirable create a desired strain in a channel region of a device using a relatively thin epitaxially grown SiGe.

It would further be desirable to create a compressive strain to increase hole mobility in the channel region of a PFET by growing an epitaxial layer of SiGe in the source and drain regions of the PFET.

It would further be desirable to provide a process for applying a desired strain in the channel region of a PFET without creating the same strain in the channel region of the NFET.

SUMMARY OF THE INVENTION

According to an aspect of the invention, a p-type field effect transistor (PFET) and an n-type field effect transistor (NFET) of an integrated circuit are provided. A first strain is applied to the channel region of the PFET but not the NFET via a lattice-mismatched semiconductor layer such as silicon germanium disposed in source and drain regions of only the PFET and not of the NFET. A process of making the PFET and NFET is provided. Trenches are etched in the areas to become the source and drain regions of the PFET and a lattice-mismatched silicon germanium layer is grown epitaxially therein to apply a strain to the channel region of the PFET adjacent thereto.

In an aspect of the invention, a layer of silicon can be grown over the silicon germanium layer and a salicide formed from the layer of silicon to provide low-resistance source and drain regions. Simultaneously, the salicide can be formed in the gate conductors of the PFET and NFET.

DETAILED DESCRIPTION

Figure 1:
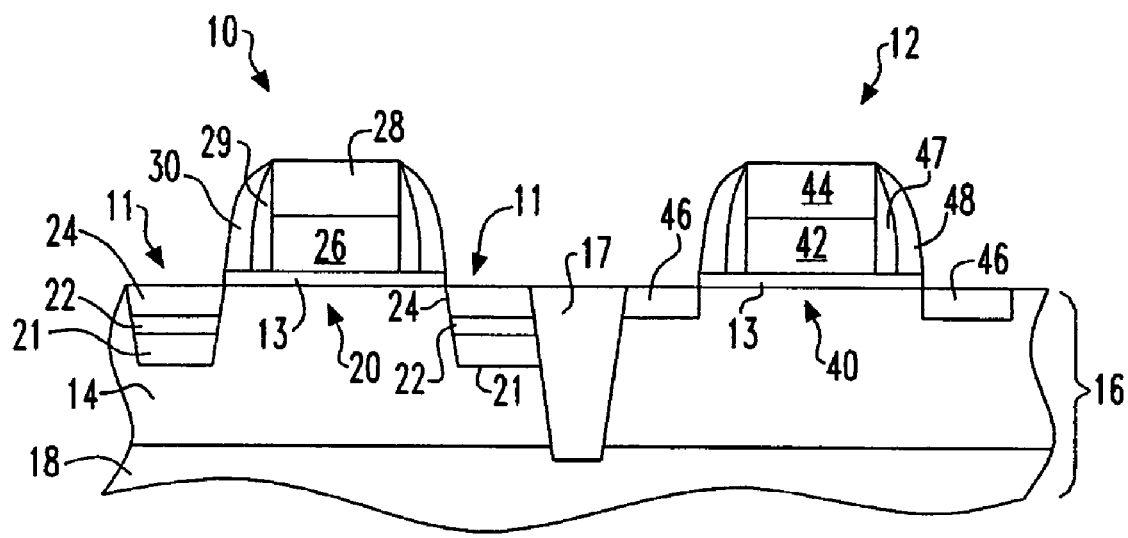
FIG. 1 illustrates a PFET and an NFET according to an embodiment of the invention.

FIG. 1 illustrates a p-type field effect transistor (PFET) and an n-type field effect transistor (NFET) according to an embodiment of the invention. As illustrated in FIG. 1, the PFET 10 and NFET 12 are fabricated in a single-crystal semiconductor region 14 of a substrate 16, separated by a trench isolation region 17, typically of oxide. The substrate 16 may either be a bulk substrate or may preferably be a semiconductor-on-insulator or silicon-on-insulator (SOI) substrate in which a relatively thin layer of a semiconductor is formed over an insulating layer 18. When field effect transistors (FETs) are formed in such SOI substrates, faster switching operation is often achieved than otherwise, because junction capacitance between the channel region of the transistor and the bulk substrate is eliminated. The substrate is preferably a bulk single-crystal silicon substrate, and more preferably a silicon SOI substrate having a single-crystal silicon region above an insulating layer. As described in this and the embodiments to follow, reference will be made to fabrication of transistors within a single-crystal silicon region of a substrate, as opposed to other types of semiconductors such as III-V compound semiconductors, e.g. gallium arsenide (GaAs).

As shown in FIG. 1, the PFET 10 includes a channel region 20 disposed below a polysilicon portion 26 of a gate conductor. The polysilicon portion 26 is preferably heavily doped to a concentration of about $10^{19}$ cm$^{-3}$. Preferably the polysilicon portion 26 includes a p-type dopant such as boron for the purpose of matching the workfunction of the p-type conduction channel that exists when the PFET is turned on in operation. The gate conductor preferably also includes a low-resistance portion 28 disposed above the polysilicon portion 28. The low-resistance portion 28 has much less resistance than the polysilicon portion 26, and preferably includes a metal, a silicide of a metal, or both. In a preferred embodiment, the low-resistance portion 28 includes a silicide such as a silicide of cobalt (CoSi$_2$).

A pair of silicided raised source-drain regions 11 are disposed in single-crystal semiconductor regions on sides of the gate conductor 26. Each of the raised source-drain regions 11 is displaced from the gate conductor 26 by a pair of spacers 29, 30. Spacers 29 and 30 are both preferably formed of silicon nitride, although spacer 30 can be formed of silicon dioxide instead or a combination of layers of silicon nitride and silicon dioxide, e.g. silicon oxynitride.

A first strain is applied to the channel region 20 via a buried single-crystal layer 21 of a second semiconductor disposed under the source-drain regions 11 of the PFET 10. The second semiconductor 21 is preferably a lattice-mismatched semiconductor incorporating silicon and one or more other group IV elements such as carbon (C) or germanium (Ge). The second semiconductor layer 21 is most preferably silicon germanium. A layer 22 of the first semiconductor, preferably being silicon, is disposed above the second semiconductor layer 21. Preferably, a low resistance contact layer 24, preferably being a silicide, is disposed above the first semiconductor layer 22. The low-resistance layer is preferably a silicide, and more preferably a silicide of cobalt, i.e. CoSi$_2$.

The presence of a lattice-mismatched second semiconductor on sides of the channel region of the PFET 10 produces a strain in the channel region 20. Preferably, the strain is compressive. Such compressive strain can range from a value as low as 50 MPa (megapascals) to several GPa (gigapascals). The strain produces a positive effect upon mobility of charge carriers within the channel region 20, which can measure up to several times the mobility of a PFET channel region which does not have such strain applied thereto.

As the first semiconductor is preferably silicon, the lattice-mismatched second semiconductor is preferably a different semiconductor such as silicon germanium or silicon carbide, and more preferably silicon germanium (Si$_x$Ge$_y$) where x and y are percentages where x plus y equals 100 percent. The ranges of variation between x and y can be rather large, y illustratively varying from 1% to 99%, and in such case, x consequently varying between 99% and 1%.

Alternatively, the single crystal region of the substrate 14 may consist essentially of silicon germanium in proportions according to a first formula Si$_{x1}$Ge$_{y1}$, where x1 and y1 are percentages where x1+y1=100%, and the layer of the second semiconductor consists essentially of silicon germanium in different proportions according to a second formula Si$_{x2}$Ge$_{y2}$, where x1 and y1 are percentages where x2+y2=100%, x1 not equal to x2, y1 not equal to y2.

As also illustrated in FIG. 1, an NFET 12 is provided in the single-crystal region 14 of the substrate. The NFET 12 includes a channel region 40 disposed under a heavily doped n-type polysilicon portion 42 of a gate conductor which, in turn, is disposed under a low-resistance portion 44 of the NFET 12. The low-resistance portion 44, like the low-resistance portion 28 of the PFET 10, can include a metal, a silicide, or both, and most preferably includes a silicide of cobalt (CoSi$_2$).

The NFET 12 also includes a pair of low-resistance raised source-drain contact regions 46, each preferably including a low-resistance material such as a silicide, most preferably a silicide of cobalt (CoSi$_2$). Preferably, each of the raised source-drain contact regions 46 are spaced from the gate conductor portions 42, 44 by a pair of spacers 47, 48. Spacer 47 preferably includes silicon nitride, and spacer 48 preferably includes silicon nitride, silicon dioxide or a combination of silicon nitride and silicon dioxide.

NFET 12 does not have a first strain applied to the channel region 40 thereof, i.e. strain of the type and magnitude of the strain that is applied to the channel region 20 of the PFET 10. This is because of the following reasons. First, the NFET 12 has an n-type conduction channel having electrons as the dominant carrier. The NFET 12 has a faster switching speed than a PFET 10, when all other things are equal, because a PFET has a p-type conduction channel having holes rather than electrons as the dominant carrier. Holes have less mobility than electrons, hence the faster switching speed in the NFET 12. Thus, the switching speed of the PFET 10 must be increased to at least match that of NFET 12.

Secondly, the same type of and magnitude of strain cannot be applied to both PFET 10 and NFET 12 because it would not have the same effect on NFET 12. A high magnitude compressive strain (e.g 50 MPa to several GPa) applied to the channel region 40 of the NFET 12 would actually reduce the mobility of the electrons therein, leading to a slower, rather than faster switching speed as desired.

Figure 2:
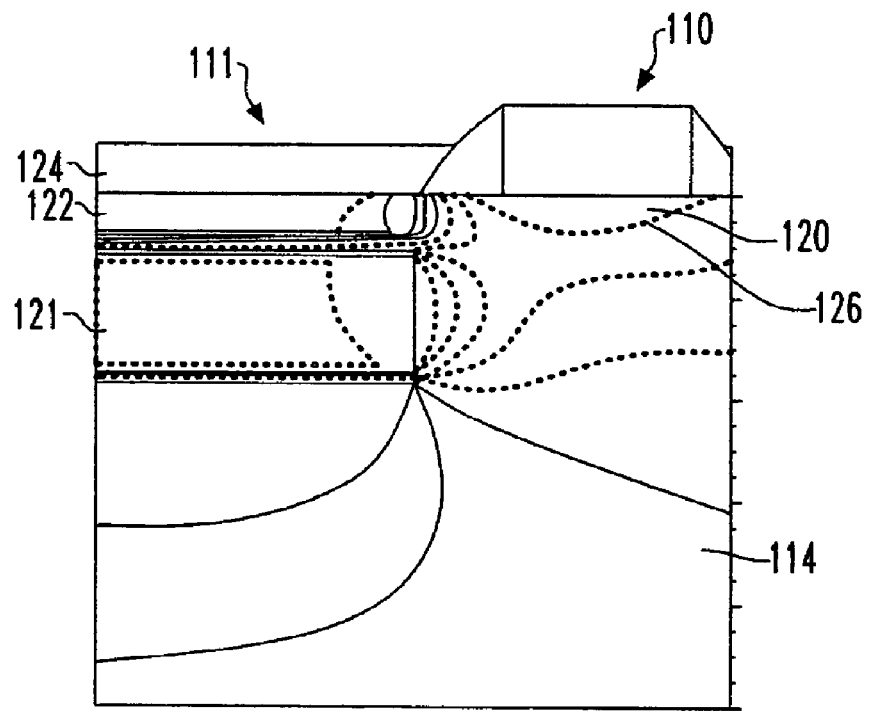
FIG. 2 illustrates a strain profile of a PFET according to an embodiment of the invention.

FIG. 2 is a diagram illustrating a strain profile of a PFET 110 within a single-crystal region 114 of a substrate. The PFET 110 has a structure as described above for PFET 10, having a channel region 120 and raised source-drain regions on each side of the gate conductor, of which one raised source-drain region 111 is shown. The raised source-drain region 111 includes a silicide region 124 disposed over a layer of silicon 122, which in turn is disposed over a relatively thin layer 121 of a lattice-mismatched second semiconductor such as silicon germanium. The thin layer 121, in turn, is disposed within a single-crystal region 114 of the substrate.

In FIG. 2, the curved lines within the substrate 114 indicate locations where a strain of the same magnitude and type (i.e. whether compressive or tensile) is present. Thus, line 126 indicates locations of an equal strain applied to the channel region 120. A compressive strain ranging between 50 MPa and 2 GPa is preferably applied at such locations of the channel region 120 of the PFET 110. More preferably, a compressive strain between 100 MPa and 1 GPa is applied to the channel region 120. Most preferably, a compressive strain ranging between 200 MPa and 600 MPa is applied thereto, such that 400 MPa is a desired target for the strain. In the source-drain region 111, the magnitude and direction of strain is very different from the strain in the channel region 120. In the buried SiGe layer 121, the strain can range from 1 to 5 GPa, with 2.5 GPa being an approximate amount achieved for a particular geometry and dimensions of the PFET to apply the desired strain to the channel region 120. On the other hand, the silicon layer 122 overlying the SiGe layer has a tensile strain applied thereto. The particular magnitudes of the strains in the source-drain region 111 are not so important. Applying a strain of a desired magnitude and direction to the channel region 120 of the PFET is the actual goal. Such strain is applied to the PFET, and not to the NFET, by performing processing methods according to embodiments of the invention.

Figure 3:
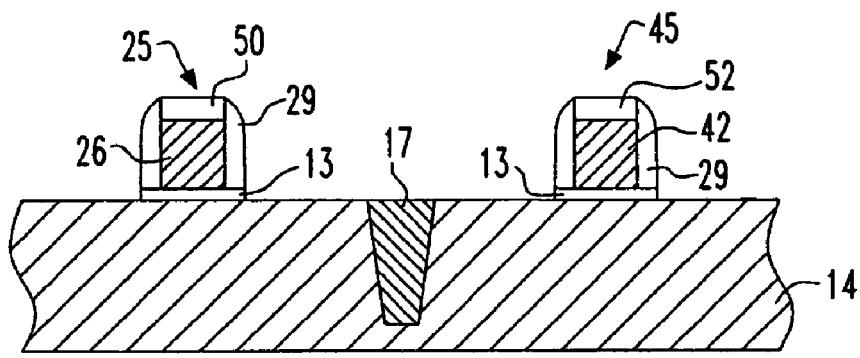
FIGS. 3 through 9 illustrate stages in fabrication of a PFET and an NFET according to an embodiment of the invention.

FIG. 3 illustrates a first stage of a CMOS fabrication process according to an embodiment of the invention. As a result of processing according to the embodiment, a p-type field effect transistor (PFET) and an n-type field effect transistor (NFET) are formed. In the PFET, a first strain is applied to the channel region by a lattice-mismatched semiconductor layer. On the other hand, in the channel region of the NFET, the first strain is not applied since the lattice-mismatched semiconductor layer is not in close proximity thereto. In such manner, an increase in carrier mobility of the PFET is achieved while still maintaining desirable performance in the NFET.

FIG. 3 illustrates a stage in processing to form a PFET and an NFET according to an embodiment of the invention. As shown in FIG. 3, a PFET gate stack 25 and an NFET gate stack 45 are formed overlying a single-crystal region of a substrate. The single-crystal region 14 consists essentially of a first semiconductor material such as silicon. The PFET gate stack 25 includes a gate dielectric 13 overlying the single-crystal region 14, a pair of spacers 29 formed on sidewalls of the gate conductor layer 26 and an insulating cap 50. The NFET gate stack 45 includes a gate dielectric 13 overlying the single-crystal region 14, a pair of spacers 47 formed on sidewalls of the gate conductor layer 42 and an insulating cap 52, also preferably formed by deposition of an oxide from a precursor of tetra-ethylorthosilicate (TEOS).

The gate conductor layers 26, 42 preferably include only a heavily doped semiconductor, most preferably being a heavily doped polysilicon at this stage of processing. Preferably, the gate conductors 26, 42 of the respective PFET gate stack and NFET gate stack are already provided at this stage with desired dopant types and concentrations to provide desirable workfunctions. For example, the PFET gate stack may be provided with a p+ doped gate conductor layer 26 while the NFET gate stack may be provided with an n+ doped gate conductor layer 42. The spacers 29 are preferably formed of a deposited nitride and the insulating caps 50, 52 are preferably formed by deposition of an oxide from a precursor of tetra-ethylorthosilicate (TEOS).

Figure 4:
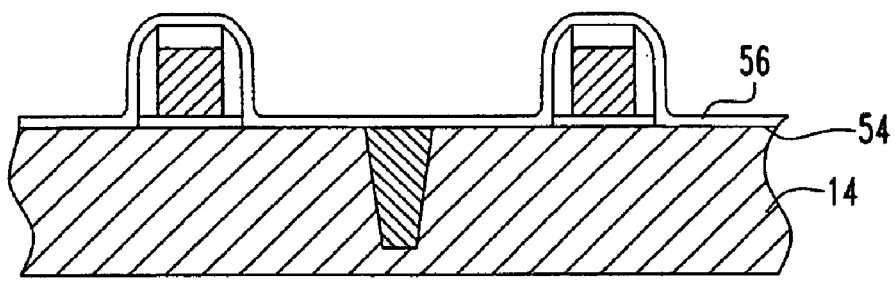
Figure 5:
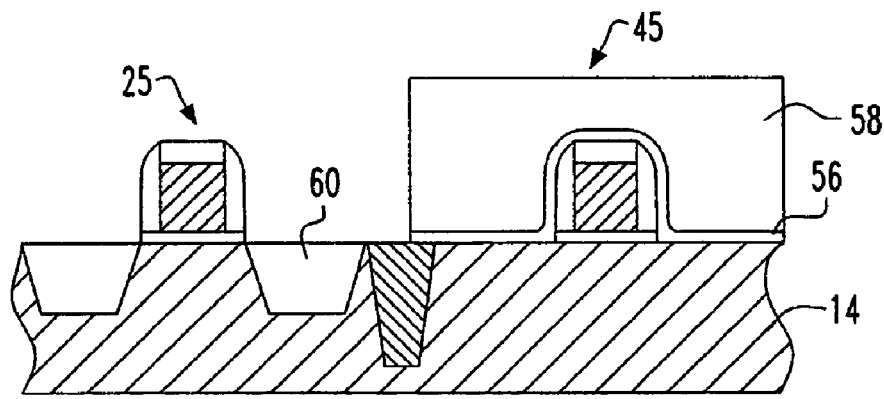

Next, as shown in FIG. 4, a coating 56 is applied to the main surface 54 of the single-crystal region 14 of the substrate. The coating 56 is desirably applied by depositing a removable material which can limit the deposition of silicon in a selective deposition process. Preferably, the material is silicon nitride, and the material is preferably applied by deposition. Next, as shown in FIG. 5, a masking material 58 is applied to the substrate and patterned to cover areas of the single-crystal region 14 on sides of the NFET gate stack 45 but not areas of the single-crystal region 14 on sides of the PFET gate stack 25. In an embodiment, the masking material is preferably a photoresist. Alternatively, the masking material can be any one of several well-known etch-resistant materials which can later be completely removed such as antireflective coating (ARC), spin-on-glass, oxide from a TEOS precursor, or various doped glasses such as borosilicate glass (BSG), arsenic doped glass (ASG), phosphosilicate glass (PSG) or borophosphosilicate glass (BPSG) which can be deposited and thereafter removed.

Thereafter, the single-crystal region 14 is etched on sides of the PFET gate stack 25, preferably by an anisotropic vertical etch process such as a reactive ion etch (RIE). During such etch, the PFET gate stack 25 provides a mask, preventing areas below the PFET gate stack 25 from being etched. Areas of the single-crystal region 14 on sides of the NFET gate stack 45 are not etched because they are protected by the masking layer 58 and the coating 56. As a result of the etching, trenches 60 are formed in the single-crystal region 14 on both sides of the PFET gate stack 25. After etching the trenches 60, the masking layer 58 is removed, as by a timed isotropic etch. This also has the effect of removing portions of the single-crystal silicon within the trenches 60 that may have become damaged as a result of the RIE etch.

Figure 6:
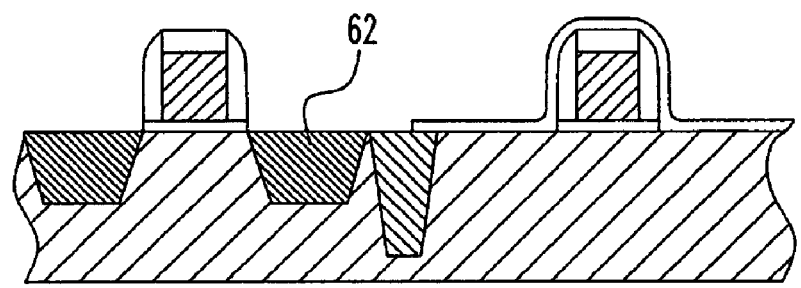

Thereafter, as shown in FIG. 6, a layer 62 of a second semiconductor is grown epitaxially on the first semiconductor of the single-crystal region 14 in the trenches 60. The epitaxial growth process is preferably performed by selective deposition such that very little material or none of the second semiconductor is deposited on surfaces other than as grown on the single-crystal semiconductor within the trenches 60. The second semiconductor is a lattice-mismatched semiconductor capable of creating a strain as a layer grown in contact with a single-crystal region of another semiconductor.

Figure 7:
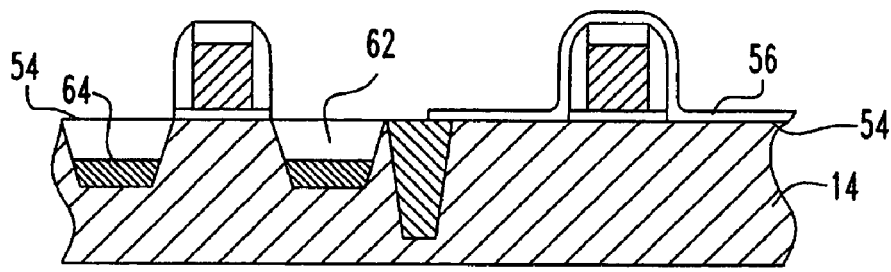

Next, as shown in FIG. 7, with the coating 56 still in place to protect the areas in which the NFET will be formed, the epitaxially grown second semiconductor layer 62 is recessed to a desirable level 64 below the main surface 54 of the single-crystal region of the substrate 14. This recessing step is preferably performed by a timed anisotropic reactive ion etch. Alternatively, the recessing step can be performed by an isotropic etch, selective to silicon, such that the etch proceeds faster against the exposed silicon germanium while etching the underlying silicon single-crystal region comparatively less.

Figure 8:
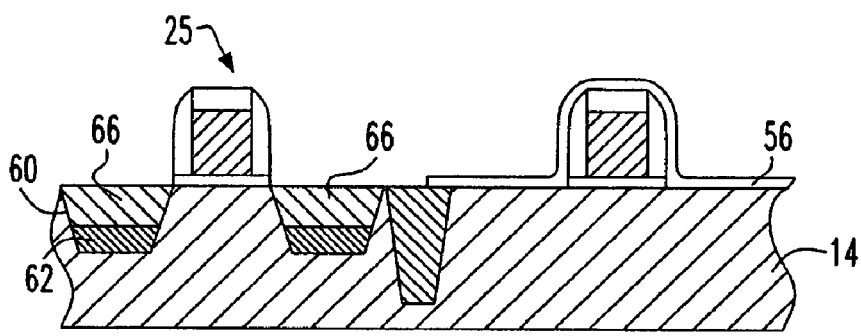

Next, as shown in FIG. 8, a second layer 66 of single-crystal silicon is epitaxially grown over the recessed layer 62 of silicon germanium. The second layer 66 is preferably grown in a selective epitaxial deposition, such that comparatively little or no silicon is deposited except on the exposed areas of the silicon germanium layer 62 and exposed areas of the single-crystal silicon along the sidewalls of the trenches 60. Thus, as a result of the selective epitaxial deposition, comparatively little or no silicon is deposited on the coating 56 and the PFET gate stack 25.

Figure 9:
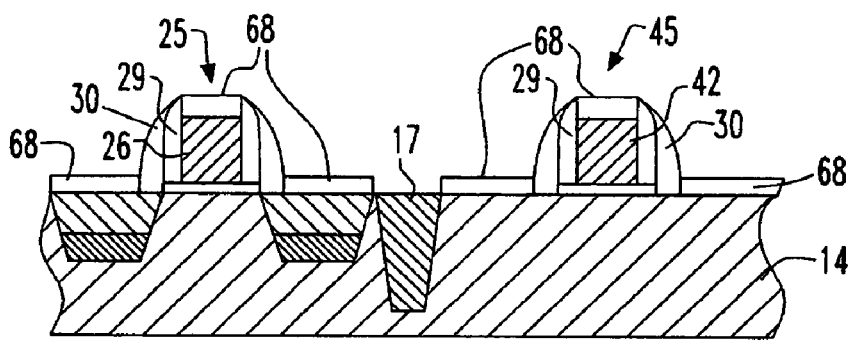

Next, as shown in FIG. 9, the coating 56 is removed from the single-crystal region 14 on sides of the NFET gate stack 45. Next, a second pair of spacers 30, preferably including an oxide material, are formed on sides of the PFET gate stack 25 and the NFET gate stack 45. The spacers 30 are preferably formed by conformally depositing an oxide material such as from a TEOS precursor followed by an anisotropic vertical etch such as RIE. The etch is preferably performed selective to silicon so as to avoid overly recessing the top layer of silicon 66. As a result of this etch step, the insulating caps 50 are removed from the PFET gate stack 25 and the NFET gate stack 45, exposing the polysilicon portions 26 and 42 below.

Thereafter, as shown in FIG. 9, a silicide 68 is formed on the exposed semiconductor layer 66, and the exposed single-crystal region on sides of the NFET gate stack 45. At the same time, a silicide is formed on the exposed polysilicon portions 26, 42 of the PFET gate stack and the NFET gate stack, respectively. The silicide is preferably a silicide of cobalt ($CoSi_2$) which is preferably formed in a self-aligned manner (i.e., a "salicide") by depositing a layer of cobalt over the processed substrate. Then, annealing is performed to react the cobalt with the silicon in contact therewith to form the silicide 68. The unreacted cobalt is then removed from remaining areas of the processed substrate; that is, the spacers 29, 30 and the trench isolation 17.

Figure 10:
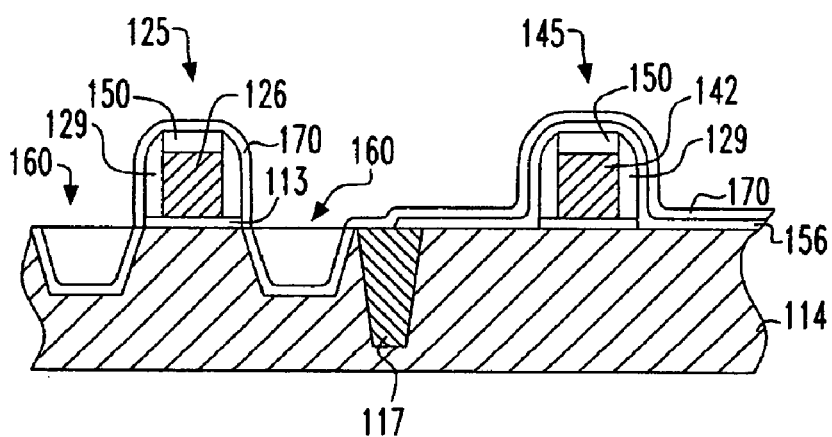
FIGS. 10 through 15 illustrate stages in fabrication of a PFET and an NFET according to another embodiment of the invention.

FIGS. 10-14 illustrate stages in fabrication of a chip having a strained channel region PFET and an NFET according to another method embodiment. FIG. 10 illustrates a stage in processing, after the formation of a PFET gate stack 125 and an NFET gate stack 145. These gate stacks have the same structure as described above with reference to FIG. 3. For example, PFET gate stack has a gate conductor 126 overlying a gate dielectric 113, nitride sidewall spacers 129 and oxide insulating cap 150. The NFET gate stack 145 has the same structure. A trench isolation 117 lies between areas of the single-crystal region 114 of the substrate over which the PFET gate stack 125 and the NFET gate stack 145 are disposed.

FIG. 10 shows a stage in processing similar to that shown in FIG. 5. A conformal masking layer 156 has been deposited over the PFET gate stack 125 and the NFET gate stack 145. The conformal masking layer 156 preferably comprises an oxide such as silicon dioxide. Layer 156 is removed from the area of the single-crystal region 114 surrounding the PFET gate stack 125. This can be done in the same manner as that described above relative to FIG. 5, by block masking the single-crystal region 114 surrounding the NFET gate stack 145 and thereafter vertically etching the layer 156 and the underlying areas 160 of the single-crystal region using an anisotropic etch such as RIE. During this etch the areas 160 are not etched as deeply as they are in the above-described embodiment. Rather, the areas 160 are etched only partially. Later, this etch will define the level at which a top layer of silicon will be formed.

Figure 11:
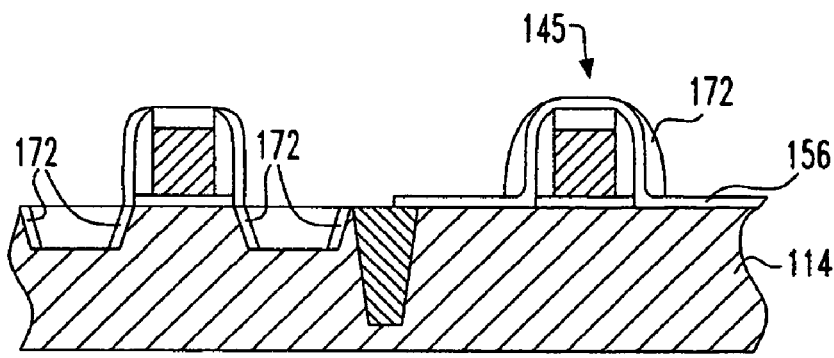

Next, a second conformal masking layer 170 is deposited to form the structure as shown. This layer 170 is preferably silicon nitride as a conformal masking layer 170 that is capable of providing a stop against a subsequent step of selectively growing the lattice-mismatched semiconductor. Next, as shown in FIG. 11, an anisotropic vertical etch process such as RIE is performed to remove the masking layer 170 from the bottoms of the trenches 160. During this process, spacers 172 remain on sidewalls of the trenches 160 and gate stacks 125, 145. During the etch, the masking layer 170 is removed from all horizontal surfaces such as from insulating caps 150 and from over the first masking layer 156 in areas of the single-crystal region 114 surrounding the NFET gate stack 145.

Figure 12:
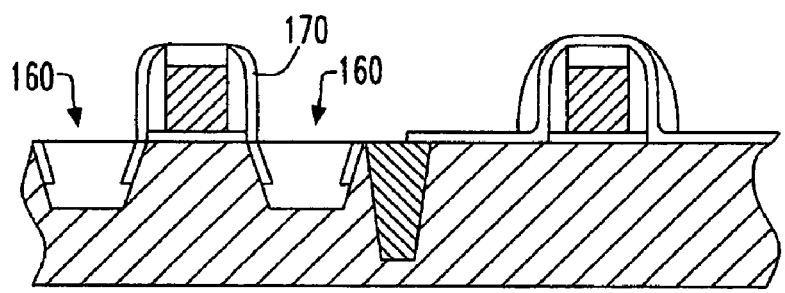

After this etch, the trenches 160 are further recessed, as by an anisotropic vertical RIE selective to the material of the masking layer 170, resulting in the structure as shown in FIG. 12. For example, if the masking layer 170 includes silicon nitride, then the etch is performed selective to silicon nitride. Alternatively, this step can be performed by an isotropic etch selective to silicon nitride.

Figure 13:
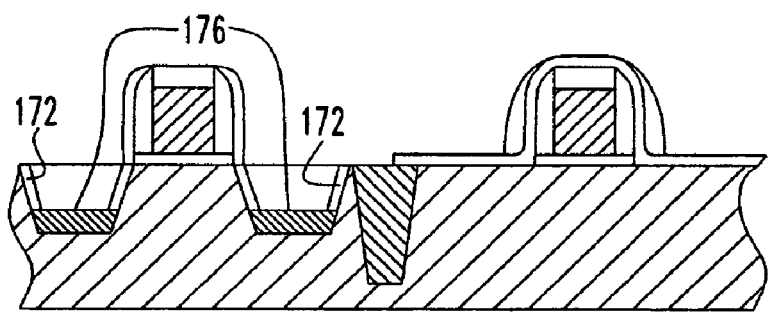

Next, as illustrated in FIG. 13, a lattice-mismatched semiconductor is selectively grown in the trenches 160. The lattice-mismatched semiconductor is preferably silicon germanium. By this process, a layer 176 of silicon germanium is epitaxially grown on the bottom and sidewalls of the trenches 160 up to the level of the spacers 172 but not deposited elsewhere.

Figure 14:
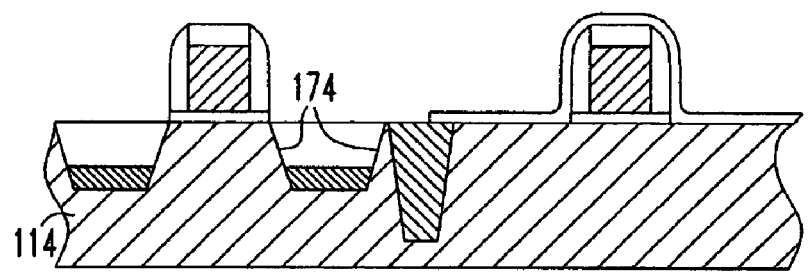

Thereafter, as shown in FIG. 14, the masking layer 170 and spacers 172 are removed as by an isotropic wet strip process selective to silicon and the silicon germanium material in the trenches 160. As a result, the single-crystal region 114 along the sidewalls 174 of the trenches is exposed.

Figure 15:
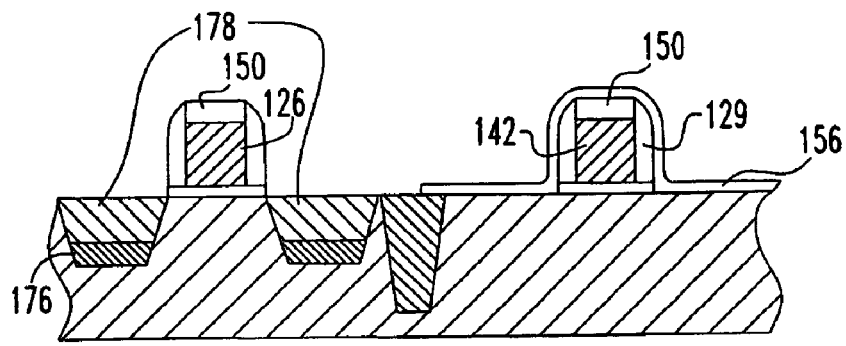

Next, a step is performed to selectively grow an epitaxial layer 178 of silicon in the trenches 160 over the silicon germanium layer 176. This results in the structure as shown in FIG. 15, which is similar to that shown above in FIG. 8 with the exception that an oxide masking layer 156 remains over the NFET gate stack 145 in place of the nitride masking layer 56 in FIG. 8.

Thereafter, the oxide masking material 156 can be removed, using a RIE etch. By this etch, the oxide insulating caps 150 are removed while leaving the nitride sidewall spacers 129 in place. The source and drain areas over the former trenches 160 and the tops of the polysilicon gate conductor layers 126 and 142 can then be salicided, preferably by cobalt silicide, as described above relative to FIG. 9.

Figure 16:
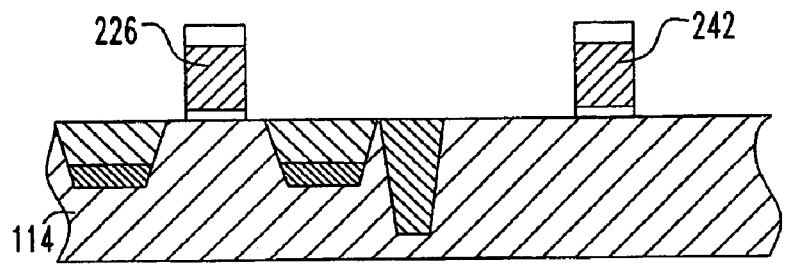
FIGS. 16 through 18 illustrate stages in fabrication of a PFET and an NFET according to yet another embodiment of the invention.
Figure 17:
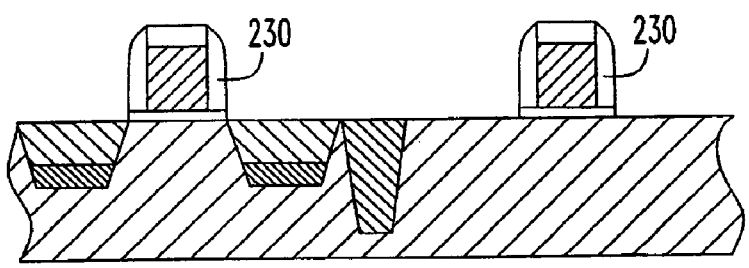
Figure 18:
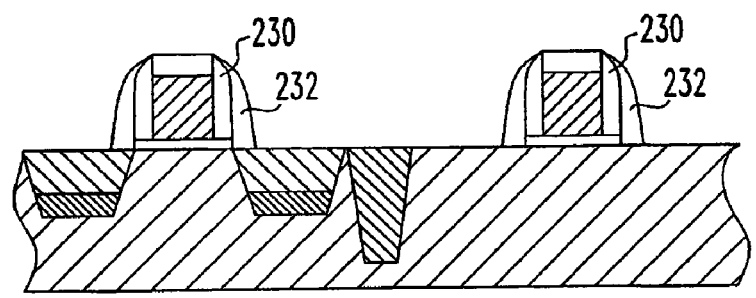

FIGS. 16 through 18 illustrate an alternative embodiment to that described above relative to FIG. 9. This alternative embodiment proceeds from a stage of processing such as that shown in FIG. 8 or FIG. 15. As shown in FIG. 16, in this embodiment, the oxide masking layer 156 and the spacers 29 (or 129) are removed from the polysilicon gate conductors 26, 42 (or 126, 142) and new spacers are provided in their place. The purpose of this is to avoid device parameter shift brought about by changes in the characteristics of the spacers (e.g. incorporation of species) due to the increased thermal budget of the silicon germanium and silicon epitaxial growth processes.

As shown in FIG. 17, first spacers 230 are formed on the polysilicon gate conductors 226, 242. This is preferably performed by conformally depositing silicon nitride and thereafter vertically etching, as by RIE. Then, extension and halo implants are performed into the source and drain regions of the PFET (i.e. into the areas of the single-crystal region 114 to the sides of spacers 230 of the PFET gate stack). Extension and halo implants are also performed into the source and drain regions of the NFET (i.e. into the areas of the single-crystal region 114 to the sides of spacers 230 of the NFET gate stack). Extension and halo implants are performed with only a first spacer 230 in place in order to implant to regions closer to the channel region of the PFET and NFET transistors in each case.

Thereafter, second spacers 232 are formed on the spacers 230 and then source and drain implants are performed on sides of the PFET gate stack to form PFET source and drain regions; and source and drain implants are performed on sides of the NFET gate stack to form NFET source and drain regions. In this way, the source and drain implanted regions are spaced a desirable distance from the channel regions of the transistors.

Thereafter, a salicide can be formed, in a manner such as that described above in the source and drain regions and over the polysilicon portions 226 and 242 of the PFET gate stack and the NFET gate stack, respectively.

The foregoing has described ways of fabricating a PFET and an NFET of an integrated circuit such that a first strain is applied to the channel region of the PFET via a lattice-mismatched semiconductor layer disposed in source and drain regions of the PFET. The first strain is not applied to the channel region of the NFET by virtue that the lattice-mismatched semiconductor layer is only disposed in the source and drain regions of the PFET and not in the source and drain regions of the NFET.

A process of making the PFET and NFET has been described such that a lattice-mismatched semiconductor is disposed in source and drain regions of only the PFET while not in the source and drain regions of the NFET. The process, utilizing a masking layer formed over the NFET areas, relies on etching trenches in the areas to become the source and drain regions of the PFET, growing a silicon germanium layer epitaxially therein and then growing a silicon layer over the epitaxially grown silicon germanium layer.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. A method of fabricating a p-type field effect transistor (PFET) and an n-type field effect transistor (NFET), said NFET and said PFET each having a channel region, said channel region of said PFET having a first strain and said channel region of said NFET not having said first strain, said method comprising:
   forming a PFET gate stack and an NFET gate stack over a main surface of a first semiconductor region having a first composition, each of said PFET gate stack and said NFET gate stack including a gate dielectric, a gate conductor overlying said gate dielectric, a cap layer overlying said gate conductor and first spacers disposed adjacent to sidewalls of said gate conductor;
   recessing a portion of said first semiconductor region adjacent to said first spacers of said PFET gate stack while protecting another portion of said first semiconductor region adjacent to said first spacers of said NFET gate stack from being recessed;
   growing a second semiconductor region overlying said recessed portion of said first semiconductor region while preventing said second semiconductor region from growing on said another portion of said first semiconductor region adjacent to said first spacers of said NFET gate stack, wherein said second semiconductor region has a second composition lattice-mismatched to a first composition of said first semiconductor region, such that said second semiconductor region applies a first strain to said channel region of said PFET; and
   fabricating source and drain regions of said PFET adjacent to said PFET gate stack and fabricating source and drain regions of said NFET adjacent to said NFET gate stack, said step of fabricating said source regions and said drain regions including removing said first spacers from said PFET gate stack and said NFET gate stack and forming second spacers on sidewalls of said PFET gate stack and said NFET gate stack.

2. The method of claim 1 further comprising forming a self-aligned silicide overlying said source regions and said drain regions of said PFET and overlying said source regions and said drain regions of said NFET.

3. The method of claim 2 further comprising forming a self-aligned silicide overlying polysilicon portions of said gate conductors of said PFET and said NFET.

4. The method of claim 3 wherein said silicide includes a silicide of cobalt.

5. The method of claim 1, further comprising recessing said second semiconductor region below said main surface of said first semiconductor region and growing a semiconductor layer having said first composition over said recessed second semiconductor region, wherein said first composition consists essentially of silicon and said second composition includes silicon germanium having a germanium content of at least one percent.

6. The method of claim 5 wherein said first strain is a compressive strain.

7. The method of claim 5 further comprising halo implanting said NFET and said PFET, wherein said halo implanting of said PFET includes implanting said semiconductor layer having said first composition.

8. The method of claim 5 further comprising extension implanting said NFET and said PFET, wherein said extension implanting of said PFET includes implanting said semiconductor layer having said first composition.

9. The method of claim 1 wherein said second spacers have a greater thickness than said first spacers.

10. The method of claim 9 further comprising forming third spacers laterally contacting said second spacers, wherein said step of fabricating said source regions and said drain regions includes performing source and drain implants masked by said first spacers, said second spacers and said third spacers.

11. The method of claim 1, wherein said first composition consists essentially of silicon germanium according to a first formula $Si_{x1}Ge_{y1}$, where x1 and y1 are percentages, x1+y1=100%, y1 being at least one percent and said second composition consists essentially of silicon germanium according to a second formula $Si_{x2}Ge_{y2}$, where x2 and y2 are percentages, x2+y2=100%, y2 being at least one percent, wherein x1 is not equal to x2 and y1 is not equal to y2.

12. A method of fabricating a p-type field effect transistor (PFET) and an n-type field effect transistor (NFET), said NFET and said PFET each having a channel region, said channel region of said PFET having a first strain and said channel region of said NFET not having said first strain, said method comprising:
   forming a PFET gate stack and an NFET gate stack over a main surface of a first semiconductor region having a first composition, each of said PFET gate stack and said NFET gate stack including a gate dielectric, a gate conductor overlying said gate dielectric, a cap layer overlying said gate conductor and first spacers disposed adjacent to sidewalls of said gate conductor;
   applying a thick mask to cover a portion of said first semiconductor region adjacent to said first spacers of said NFET gate stack and to expose another portion of said first semiconductor region adjacent to said first spacers of said PFET gate stack;
   recessing said exposed portion of said first semiconductor region adjacent to said first spacers of said PFET gate stack;
   removing said thick mask and forming a conformal coating substantially covering said portion of said first semiconductor region adjacent to said first spacers of said NFET gate stack and at least substantially exposing said recessed portion of said first semiconductor region adjacent to said first spacers of said PFET gate stack;
   selectively growing a second semiconductor region overlying said recessed portion of said first semiconductor region, said conformal coating preventing said second semiconductor region from growing on said first semiconductor region adjacent to said first spacers of said NFET gate stack, wherein said second semiconductor region has a second composition lattice-mismatched to a first composition of said first semiconductor region, such that said second semiconductor region applies a first strain to said channel region of said PFET; and fabricating source and drain regions of said PFET adjacent to said PFET gate stack and fabricating source and drain regions of said NFET adjacent to said NFET gate stack.

13. A method of fabricating a p-type field effect transistor (PFET) and an n-type field effect transistor (NFET), said NFET and said PFET each having a channel region, said channel region of said PFET having a first strain and said channel region of said NFET not having said first strain, said method comprising:

forming a PFET gate stack and an NFET gate stack over a main surface of a first semiconductor region having a first composition, each of said PFET gate stack and said NFET gate stack including a gate dielectric, a gate conductor overlying said gate dielectric, a cap layer overlying said gate conductor and first spacers disposed adjacent to sidewalls of said gate conductor;

applying a first mask to cover a portion of said first semiconductor region adjacent to said first spacers of said NFET gate stack and to expose another portion of said first semiconductor region adjacent to said first spacers of said PFET gate stack;

partially recessing said exposed portion of said first semiconductor region adjacent to said first spacers of said PFET gate stack;

removing said first mask and forming a first conformal coating substantially covering said portion of said first semiconductor region adjacent to said first spacers of said NFET gate stack and at least substantially exposing a bottom of said recessed portion of said first semiconductor region adjacent to said first spacers of said PFET;

forming an inner spacer covering an inner wall of said recessed portion of said first semiconductor region;

further recessing said partially recessed portion of said first semiconductor region;

selectively growing a second semiconductor region overlying said recessed portion of said first semiconductor region, wherein said first conformal coating prevents said second semiconductor region from growing on said first semiconductor region adjacent to said first spacers of said NFET gate stack, said inner spacer determines a location of said second semiconductor region, and said second semiconductor region has a second composition lattice-mismatched to a first composition of said first semiconductor region, such that said second semiconductor region applies a first strain to said channel region of said PFET; and fabricating source and drain regions of said PFET adjacent to said PFET gate stack and fabricating source and drain regions of said NFET adjacent to said NFET gate stack.

14. The method of claim 13, wherein said second semiconductor region has a top surface parallel to said main surface, wherein a depth of said inner spacer determines a depth of said top surface from said main surface.

15. The method of claim 13 further comprising growing a semiconductor layer having said first composition over said second semiconductor region.

16. The method of claim 13 wherein said first composition consists essentially of silicon and said second composition includes silicon germanium, said silicon germanium having a germanium content of at least one percent.

17. The method of claim 13, wherein said first composition consists essentially of silicon germanium according to a first formula $Si_{x1}Ge_{y1}$, where x1 and y1 are percentages x1+y1=100%, y1 being at least one percent and said second composition consists essentially of silicon germanium according to a second formula $Si_{x2}Ge_{y2}$, where x2 and y2 are percentages, x2+y2=100%, y2 being at least one percent, wherein x1 is not equal to x2 and y1 is not equal to y2.

* * * * *